(12) United States Patent
Kamins

(10) Patent No.: US 7,608,854 B2
(45) Date of Patent: Oct. 27, 2009

(54) ELECTRONIC DEVICE AND METHOD OF MAKING THE SAME

(75) Inventor: Theodore I. Kamins, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 18 days.

(21) Appl. No.: 11/668,136

(22) Filed: Jan. 29, 2007

(65) Prior Publication Data

US 2008/0179586 A1      Jul. 31, 2008

(51) Int. Cl.
*H01L 29/06* (2006.01)
*H01L 21/20* (2006.01)

(52) U.S. Cl. .......................... 257/24; 257/12; 438/478; 438/962; 977/762

(58) Field of Classification Search ............. 257/12, 257/24, E29.086, E29.242, E29.245, 14; 977/762, 938; 438/478, 962

See application file for complete search history.

(56) References Cited

U.S. PATENT DOCUMENTS

| | | | |
|---|---|---|---|
| 6,559,468 B1 * | 5/2003 | Kuekes et al. ................ 257/14 |
| 6,798,000 B2 | 9/2004 | Luyken et al. |
| 6,887,365 B2 | 5/2005 | Naughton |
| 6,963,077 B2 | 11/2005 | Dehon et al. |
| 7,067,867 B2 | 6/2006 | Duan et al. |
| 2006/0057360 A1 | 3/2006 | Samuelson et al. |

OTHER PUBLICATIONS

Yasseri, et al, "Electroless Deposition of Au Nanocrystals on Si(111)Surfaces as Catalysts for Epitaxial Growth of Si Nanowires" Electrochemical & Solid-State Ltrs(2006)C185-C188.
Yasseri, et al. "Growth and Use of Metal Nanycrystal Assemblies on High-Density Silicon Nanowires Formed by Chemical Vapor Deposition", Appl.Phys.A 82, (2006),pp. 659-664.

* cited by examiner

*Primary Examiner*—Hung Vu

(57) ABSTRACT

An electronic device includes a primary nanowire of a first conductivity type, and a secondary nanowire of a second conductivity type extending outwardly from the primary nanowire. A doped region of the second conductivity type extends from the secondary nanowire into at least a portion of the primary nanowire.

20 Claims, 4 Drawing Sheets

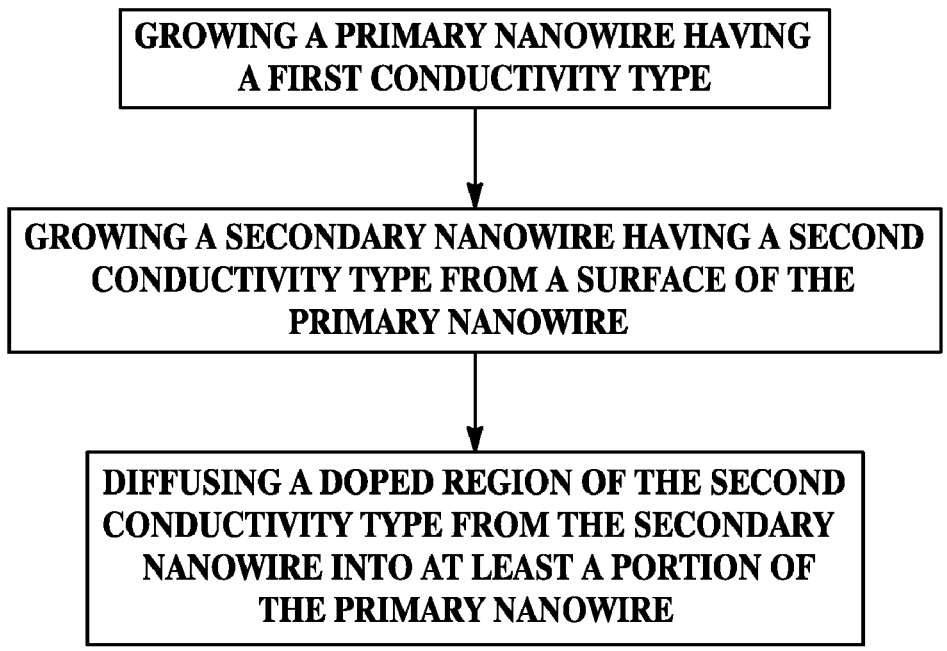
FIG. 1
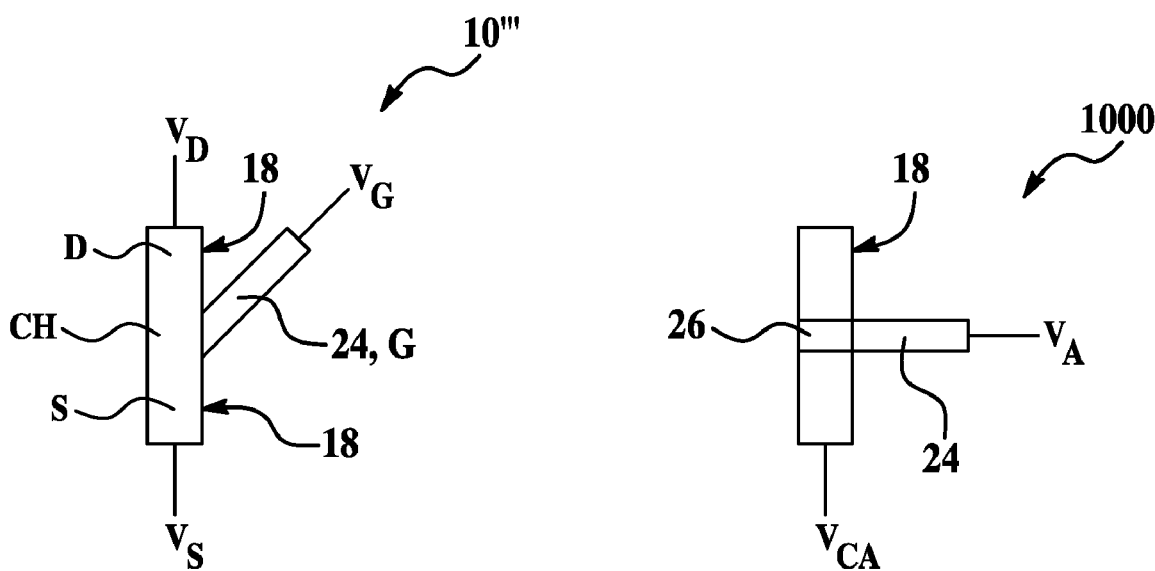
FIG. 7        FIG. 8

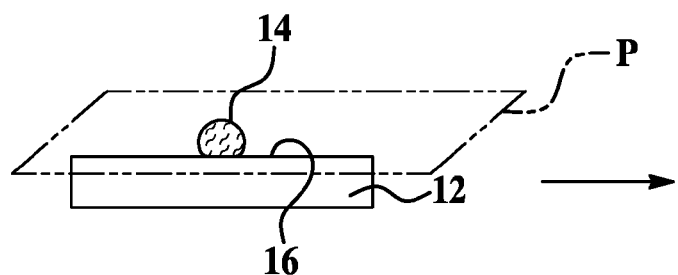
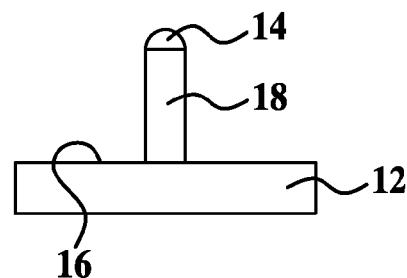
FIG. 2A  FIG. 2B
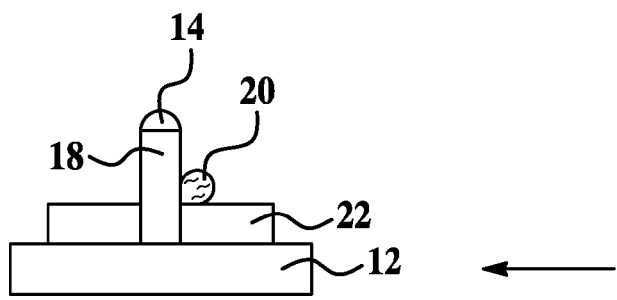
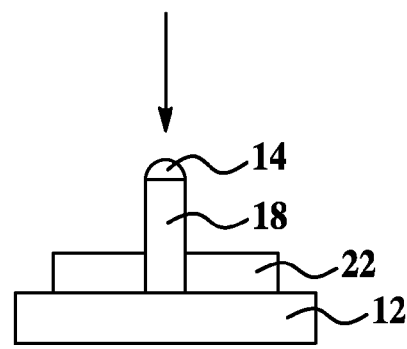
FIG. 2D  FIG. 2C
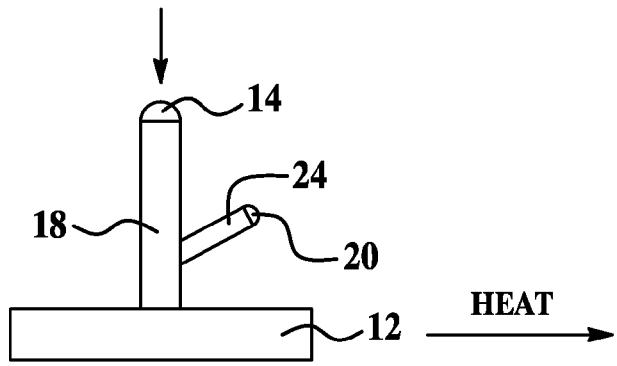
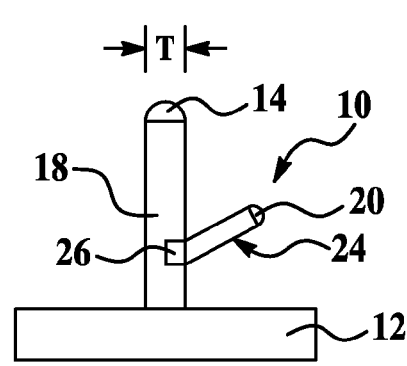
FIG. 2E  FIG. 2F
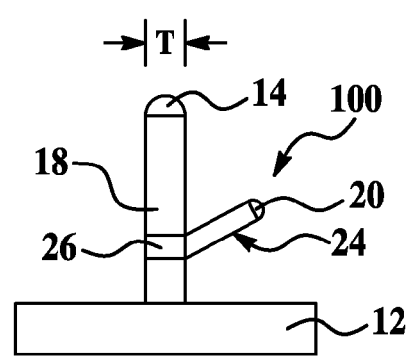
FIG. 2G

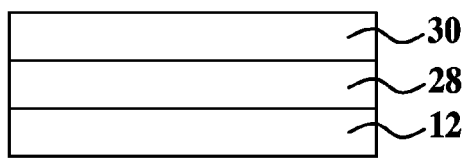
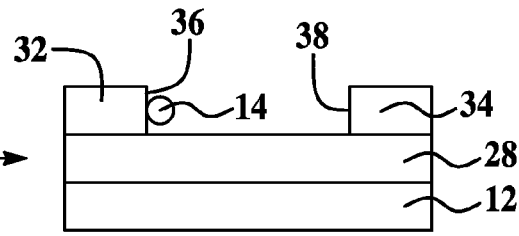
FIG. 4A     FIG. 4B
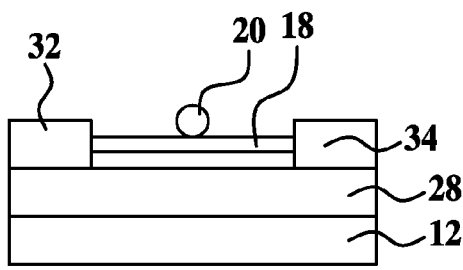
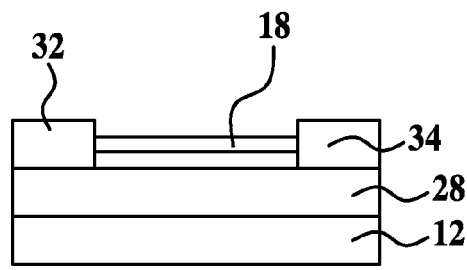
FIG. 4D     FIG. 4C
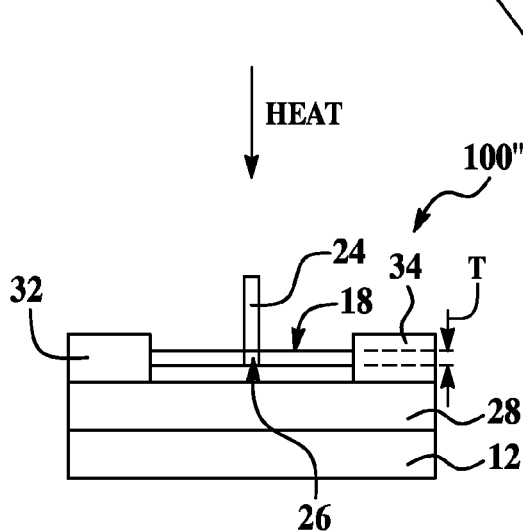
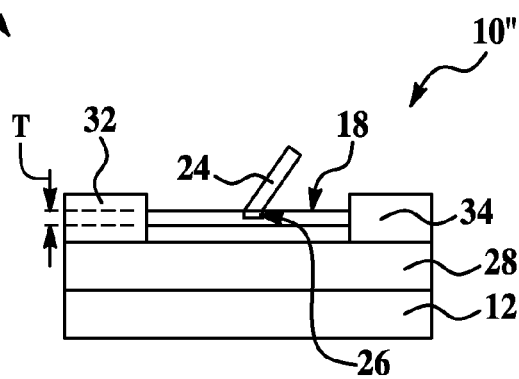
FIG. 4F     FIG. 4E

ELECTRONIC DEVICE AND METHOD OF MAKING THE SAME

BACKGROUND

The present disclosure relates generally to electronic device(s) and method(s) of making the same.

Since the inception of semiconductor technology, a consistent trend has been toward the development of smaller device dimensions and higher device densities. As a result, nanotechnology has seen explosive growth and generated considerable interest. Nanotechnology is centered on the fabrication and application of nano-scale structures, or structures having dimensions that are often 5 to 100 times smaller than conventional semiconductor structures. Nanowires are included in the category of nano-scale structures.

Nanowires are wire-like structures having at least one linear dimension (e.g., diameter) ranging from about 3 nm to about 200 nm. Nanowires are suitable for use in a variety of applications, including functioning as conventional wires for interconnection applications or as semiconductor devices. Nanowires are also the building blocks of many potential nano-scale devices, such as nano-scale field effect transistors (FETs), p-n diodes, light emitting diodes (LEDs) and nanowire-based sensors, to name a few. One conventional nano-scale building technique includes lithography, which may be intricate and costly.

BRIEF DESCRIPTION OF THE DRAWINGS

Features and advantages of embodiments of the present disclosure will become apparent by reference to the following detailed description and drawings, in which like reference numerals correspond to similar, though not necessarily identical, components. For the sake of brevity, reference numerals or features having a previously described function may not necessarily be described in connection with other drawings in which they appear.

FIG. 1 is a flow diagram depicting an embodiment of the method of making an embodiment of an electronic device;

FIGS. 2A through 2F schematically depict an embodiment of the method of making an embodiment of a junction field-effect transistor;

FIGS. 2A through 2E and 2G schematically depict an embodiment of the method of making an embodiment of a bipolar junction transistor;

FIGS. 4A through 4E schematically depict another embodiment of the method of making another embodiment of the junction field-effect transistor;

FIGS. 4A through 4D and 4F schematically depict another embodiment of the method of making another embodiment of the bipolar junction transistor;

FIG. 7 schematically depicts another embodiment of the junction field-effect transistor; and FIG. 8 schematically depicts an embodiment of a diode.

DETAILED DESCRIPTION

Figure 3A:
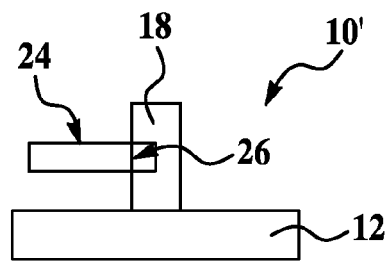
FIGS. 3A and 3B schematically depict other embodiments of the junction field-effect transistor and the bipolar junction transistor, respectively.

Some embodiments of the electronic device disclosed herein are advantageously capable of having a doped region of a secondary or branched nanowire(s) extend into a primary nanowire from which the secondary or branched nanowire(s) is grown. In an embodiment, the device includes the doped region extending entirely through the primary nanowire, and in another embodiment, the device includes the doped region extending partially through the primary nanowire. Other embodiments of the electronic device are three-terminal electronic devices that do not have the doped region extending into the primary nanowire. Selected embodiments of the described devices may be biased so that minimal current flows through the junction between the two nanowires, which, in some instances, may be advantageous. Generally, the conductivity types of the primary and secondary nanowires are different. Embodiments of the method enable the flexibility to produce different devices, such as, for example, diodes, bipolar junction transistors, or junction field-effect transistors.

Referring now to FIG. 1, one embodiment of a method for forming an electronic device is depicted. The method includes growing a primary nanowire having a first conductivity type; growing a secondary nanowire having a second conductivity type from a surface of the primary nanowire; and diffusing a doped region of the second conductivity type from the secondary nanowire into at least a portion of the primary nanowire. It is to be understood that this and other embodiments of the method are described in further detail in reference to the other figures hereinbelow.

FIGS. 2A through 2F depict an embodiment of a method for forming an embodiment of a junction field-effect transistor 10 (shown in FIG. 2F). FIG. 2A depicts a substrate 12 having a catalyst nanoparticle 14 established thereon. FIG. 2B depicts a primary nanowire 18 that is grown from the substrate surface 16.

The substrate 12 from which the primary nanowire(s) 18 is grown may be formed with the surface plane being a (111) crystal lattice plane. Such a substrate 12 is referred to as a (111) oriented Si substrate or layer. In this embodiment, the (111) plane is considered to be horizontally oriented with respect to the Cartesian coordinate system. As used herein, the term "horizontal" generally refers to a direction or a plane that is parallel with plane P shown in FIG. 2A, while the term "vertical" generally refers to a direction or plane that is substantially or approximately perpendicular to the plane P shown in FIG. 2A.

Any suitable method may be used to grow the nanowire(s) 18. In an embodiment, primary nanowire 18 growth is accomplished by establishing the catalyst nanoparticle 14 on the substrate surface 16 and exposing the catalyst nanoparticle 14 to a precursor gas that initiates growth of the nanowire 18. The (111) surface orientation enables growth of substantially vertical primary nanowire(s) 18 (shown in FIG. 2B), which grow in a typical (111) direction. The formation of such primary nanowire(s) 18 is further described in U.S. patent application Ser. No. 10/982,051, filed on Nov. 5, 2004 (U.S. Publication No. 2006/0097389, published May 11, 2006), incorporated by reference herein in its entirety.

In one embodiment, the catalyst nanoparticle 14 is formed by depositing on the substrate 12 material(s) that subsequently form the catalyst nanoparticle 14. In another embodiment, a pre-formed catalyst nanoparticle 14 is deposited on the substrate 12. In either embodiment, suitable deposition processes include, but are not limited to physical deposition processes, solution deposition processes, chemical deposition processes, electrochemical deposition processes, and/or combinations thereof.

Non-limiting examples of the types of nanowire(s) 18 that may be formed include silicon nanowires, germanium nanowires, compound semiconductor nanowires (including lattice mis-matched nanowires (e.g., indium phosphide nanowires grown on silicon with a lattice mis-match of about 8%)), or the like, or combinations thereof.

As the primary nanowire 18 grows, it may be doped with a dopant that is capable of introducing a first conductivity type thereto. The first conductivity type may be p-type conductivity or n-type conductivity. For silicon or germanium nanowires, for example, dopants for achieving p-type conductivity include, but are not limited to boron, other like elements, or combinations thereof; and dopants for achieving n-type conductivity include, but are not limited to phosphorus, arsenic, antimony, other like elements, or combinations thereof.

Once the primary nanowire 18 is grown, another catalyst nanoparticle 20 (shown in FIG. 2D) is established on the primary nanowire 18. The other catalyst nanoparticle 20 may be established on the primary nanowire 18 via those methods suitable for establishing the catalyst nanoparticle 14.

FIGS. 2C and 2D together depict another embodiment of establishing the other catalyst nanoparticle 20 on the primary nanowire 18. As shown in FIG. 2C, a sacrificial layer 22 is established about the primary nanowire 18 to a predetermined height. The predetermined height depends, at least in part, on the desirable location for the secondary nanowire 24 (shown in FIG. 2E). In one embodiment, at least a portion of the primary nanowire 18 remains exposed after the sacrificial layer 22 is established. In another embodiment, the entire primary nanowire 18 is covered with the sacrificial layer 22, and then a portion of the sacrificial layer 22 is removed to expose a desirable portion of the primary nanowire 18.

The sacrificial layer 22 may be established via depositing techniques, depositing and etching techniques together, or other like techniques, or combinations thereof. Examples of suitable depositing techniques include, but are not limited to chemical vapor deposition, physical vapor deposition, spin coating, solution deposition processes, or the like, or combinations thereof. Any suitable sacrificial layer 22 may be used, non-limitative examples of which include oxides, nitrides, oxynitrides, photoresists, polymers, or combinations thereof. In a non-limitative example embodiment, the sacrificial layer 22 is polymethylmethacrylate (PMMA). In an example embodiment, the sacrificial layer 22 is deposited via spin-coating, planarized (e.g., via chemical mechanical polishing (CMP)), and etched back (e.g., via reactive ion etching) to a desirable height. It is to be understood that if CMP is used during establishment of the sacrificial layer 22, the nanoparticle 14 (contacting the primary nanowire 18) may be removed during such a process.

As shown in FIG. 2D, once the sacrificial layer 22 is established, the catalyst nanoparticle 20 may be deposited on an area of the exposed portion of the primary nanowire 18 that is adjacent to the sacrificial layer 22.

FIG. 2E depicts both the removal of the sacrificial layer 22, and the growth of the secondary nanowire 24. Removal of the sacrificial layer 22 may be accomplished by exposing the sacrificial layer 22 to solvents (e.g., acetone, isopropyl alcohol, photoresist stripper), with or without ultrasonic agitation. Suitable etchants may also be used to remove the sacrificial layer 22 (e.g., when the layer 22 is an oxide or a nitride). It is to be understood that such etchants are selected so as to remove the sacrificial layer 22 without deleteriously affecting the contact between the catalyst nanoparticle 20 and the primary nanowire 18. In some embodiments, annealing (prior to removing the sacrificial layer 22) may be used to form an alloy or to strengthen the physical contact between the catalyst nanoparticle 20 and the primary nanowire 18. It is to be understood that the sacrificial layer 22 may be removed either before or after the secondary nanowire 24 is grown. It is to be further understood that the sacrificial layer 22 may remain in some embodiments, and thus may be incorporated into the final electronic device.

In an embodiment, growth of the secondary nanowire 24 is initiated by exposing the catalyst nanoparticle 20 to a precursor gas. It is to be understood that growth of the secondary nanowire 24 may be accomplished via any other suitable technique.

Any of the previously described materials suitable for forming the primary nanowire 18 are also suitable for forming the secondary nanowire 24. The primary and secondary nanowires 18, 24 may be formed respectively from the same material, similar materials, or different materials. It is to be understood, however, that the secondary (or branched) nanowire 24 is doped to have a second conductivity type that is different than the first conductivity type of the primary nanowire 18. As such, if the first conductivity type is n-type conductivity, then the second conductivity type is p-type conductivity, or vice versa.

FIG. 2F depicts an embodiment of the junction field-effect transistor 10 that is formed when a doped region 26 of the second conductivity type is diffused from the secondary nanowire 24 into a portion of the primary nanowire 18. It is to be understood that the doped region 26 extends through a portion of the thickness T of the primary nanowire 18. In such an embodiment, the doped region extends through a portion of the electrically active thickness, which may be equivalent to or less than the thickness T. To form the junction field-effect transistor 10, the doped region 26 is diffused through any desirable portion of the electrically active thickness that is less than 100% of the electrically active thickness.

Diffusion may be accomplished by exposing the nanowires 18, 24 to a predetermined temperature for a predetermined time. The amount of doped region 26 that diffuses into the primary nanowire 18 is controllable via the temperature to which the nanowires 18, 24 are exposed, and the time of such exposure. As such, the exposure temperature and the time of exposure may be increased or decreased depending, at least in part, on the desirable amount of doped region 26 that is to be diffused, and on the type of transistor that is to be formed. Furthermore, the temperature and time may be altered depending, at least in part, on the materials used for the nanowires 18, 24, the diameter of the nanowire 18, the doping concentration and species, the surface state density, or combinations thereof.

As non-limiting examples, the time for diffusing through a 20 nm diameter nanowire 18 at 900° C. may be as follows: about 16 minutes for diffusion completely across the nanowire 18; and about 4 minutes for diffusion through about half of the nanowire 18. As other non-limiting examples, the time for diffusing through a 50 nm nanowire 18 at 900° C. may be as follows: about 100 minutes for diffusion completely across the nanowire 18; and about 25 minutes for diffusion through about half of the nanowire 18. As previously stated, time and temperature may be altered to accommodate, for example, different materials, dopant concentration and species, diameters, or the like, or combinations thereof.

FIGS. 2A through 2E and 2G depict an embodiment of a method for forming an embodiment of a bipolar junction transistor 100 (shown in FIG. 2G). The primary and secondary nanowires 18, 24 are formed as described herein. Similar to the embodiment of the method for forming the junction field-effect transistor 10, the nanowires 18, 24 are exposed to a predetermined temperature for a predetermined time. In this embodiment, however, the doped region 26 diffuses through the entire thickness T or at least through the entire electrically active thickness of the primary nanowire 18, as shown in FIG. 2G. The entire thickness T may be electrically active, or the thickness T may be partially electrically active and partially inactive.

One non-limiting example of the bipolar junction transistor 100 includes a boron (or other p-type) doped secondary nanowire 24 branched from a phosphorus (or other n-type) doped primary nanowire 18 having a 20 nm diameter. The nanowires 18, 24 may be exposed to a temperature of about 900° C. for about 16 minutes. It is believed that this time frame and temperature is suitable for the boron region 26 to diffuse across the diameter of the primary nanowire 18.

Figure 3B:
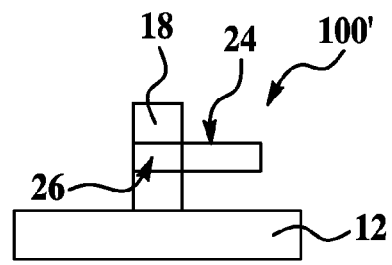

The transistors 10, 100 shown in FIGS. 2F and 2G, respectively, include the secondary nanowire 24 at a non-perpendicular angle with respect to the primary nanowire 18. It is to be understood that the secondary nanowire 24 may be grown at a predetermined angle with respect to the primary nanowire 18. It is believed that the predetermined angle at which the nanowires 18, 24 are grown depends, at least in part, on the crystal structure of the surface from which the nanowires 18, 24 are grown. FIGS. 3A and 3B depict embodiments of the junction field-effect transistor 10' and the bipolar junction transistor 100', respectively, having the secondary nanowire 24 grown substantially perpendicular to the primary nanowire 18. It is to be understood that any of the embodiments disclosed herein may have the secondary nanowire 24 at a predetermined angle with respect to the primary nanowire 18.

As depicted in the FIG. 2 series, the catalyst nanoparticle 14 may remain in contact with the tip of primary nanowire 18 after growth of the primary nanowire 18. Generally, the catalyst nanoparticle 14 is retained if further growth of the primary nanowire 18 is desirable during the formation of the secondary nanowire 24. FIGS. 2E, 2F and 2G depict such additional growth of the primary nanowire 18. It is to be understood, however, that if additional growth of the primary nanowire 18 is not desired, the catalyst nanoparticle 14 may be removed from the tip of the primary nanowire 18 prior to initiating growth of the secondary nanowire 24.

Referring now to FIGS. 4A through 4E, and FIGS. 4A through 4D and 4F together, other embodiments of the method for forming a junction field-effect transistor 10" (shown in FIG. 4E) and a bipolar junction transistor 100" (shown in FIG. 4F) are depicted. In these embodiments, a silicon-on-insulator substrate (SOI) is used, as shown in FIG. 4A. As depicted, a pre-purchased or pre-formed SOI substrate includes a substrate 12 (e.g., silicon), an insulator layer 28 (e.g., silicon dioxide), and a silicon (or other suitable material) layer 30.

In an embodiment, the silicon layer 30 of the SOI substrate preferably has (110) crystallographic orientation. Such a silicon layer 30 is cut or polished with the surface plane being a (110) crystal lattice plane. As used herein, the (110) plane is considered to be horizontally oriented with respect to the Cartesian coordinate system. The (110) oriented layer 30 further has (111) planes of the Si crystal lattice, at least some of which are approximately perpendicular to, and intersect with, the horizontally oriented (110) surface. These intersecting (111) planes are referred to herein as vertically oriented (111) planes. Such planes may also be referred to as surfaces when they are exposed at an edge of the layer 30 (i.e., where it bounds or limits the layer 30). The (111) planes are approximately vertically oriented relative to the horizontal (110) surface of the layer 30.

The silicon layer 30 of the SOI substrate may be patterned (e.g., via photolithography) and etched (e.g., via dry etching, wet chemical etching, or combinations thereof) so that posts 32, 34 having substantially vertical sidewalls 36, 38 opposite to each other are formed, as shown in FIG. 4B.

In another embodiment, the substrate 12 of the SOI substrate has (111) crystallographic orientation, and the primary nanowire 18 is grown substantially vertically from the substrate 12, across a gap that is formed by undercutting the insulator layer 28, where it connects to the silicon layer 30. Non-limiting examples of such structures are described in U.S. patent application Ser. No. 11/584,103 filed on Oct. 20, 2006, which is incorporated by reference in its entirety.

Referring back to the embodiment shown in the FIG. 4 series, any suitable method may be used to grow the primary nanowire(s) 18. In one embodiment, as shown in FIG. 4B, nanowire 18 growth is accomplished by establishing the catalyst nanoparticle 14 on one or both sidewalls 36, 38 and exposing the catalyst nanoparticle 14 to a precursor gas that initiates growth of the nanowire 18. The (111) surface orientation of the sidewall 36, 38 enables substantially horizontal growth of the primary nanowire(s) 18 (shown in FIG. 4B), which grow in a typical (111) direction. A non-limiting example of the formation of such primary nanowires 18 is described in U.S. patent application Ser. No. 10/738,176 filed on Dec. 17, 2003 (U.S. Publication No. 2005/0133476, published on Jun. 23, 2005), incorporated by reference herein in its entirety.

Referring now to FIG. 4D, another catalyst nanoparticle 20 is established on the primary nanowire 18. As previously described, the other catalyst nanoparticle 20 may be established via any suitable deposition process, including, but not limited to physical deposition processes, solution deposition processes, chemical deposition processes, electrochemical deposition processes, and/or combinations thereof. Once established, the catalyst nanoparticle 20 may be exposed to a desirable precursor gas to form the secondary nanowire 24 (see FIGS. 4E and 4F). It is to be understood that any other suitable nanowire growth process may also be employed.

As previously described in reference to the FIG. 2 series, the primary and secondary nanowires 18, 24 are doped during the respective growth processes to have different conductivity types. Upon exposure of the nanowires 18, 24 to the predetermined temperature and the predetermined time, the doped region 26 of the secondary nanowire 24 diffuses into the primary nanowire 18, as shown in FIGS. 4E and 4F.

Specifically, FIG. 4E depicts the diffusion of the doped region 26 into a portion of the thickness T of the primary nanowire 18 to form an embodiment of the junction field-effect transistor 10". In the embodiment shown in FIG. 4E, the nanowire 24 is grown at a non-perpendicular angle with respect to the primary nanowire 18. As previously mentioned, the predetermined angle at which the nanowire 24 grows is dependent upon, at least in part, the crystallographic orientation of the surface from which the nanowire 24 is grown.

FIG. 4F depicts the diffusion of the doped region 26 through the entire thickness T or at least through the entire electrically active thickness of the primary nanowire 18 to form an embodiment of the bipolar junction transistor 100". In the embodiment shown in FIG. 4F, the nanowire 24 is grown at an angle that is perpendicular to the primary nanowire 18.

Figure 5A:
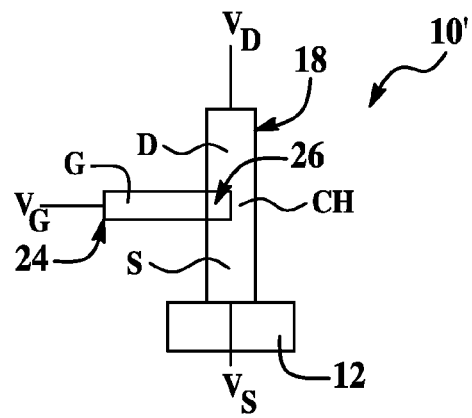
FIGS. 5A and 5B schematically depict electrical connections operatively connected to embodiments of the junction field-effect transistor and the bipolar junction transistor, respectively.
Figure 5B:
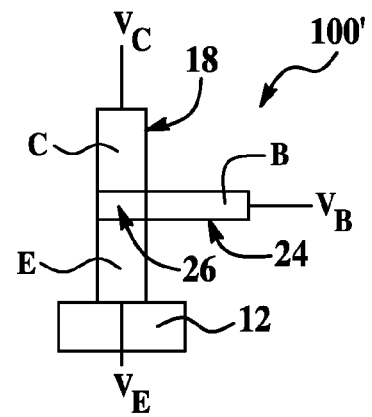

Referring now to FIGS. 5A and 5B, embodiments of the junction field-effect transistor 10, 10', 10" (FIG. 5A) and the bipolar junction transistor 100, 100', 100" (FIG. 5B) are shown having electrical connections operatively connected to three different regions of the respective devices. Specifically, the embodiments of the transistors 10', 100' depicted in FIGS. 3A and 3B are shown, respectively, in FIGS. 5A and 5B with electrical connections made thereto.

In the junction field-effect transistor 10, 10', 10" (FIG. 5A), the doped region 26 does not entirely divide the primary nanowire 18. The partially divided opposed ends of the primary nanowire 18 function as a source S and a drain D, respectively. It is to be understood that either end is capable of functioning as the source S or the drain D, as long as one end is the source S and the other end is the drain D. Electrical connections (e.g., a source electrode and a drain electrode) are made, respectively, to the terminal ends of the source S and drain D at voltages $V_S$ and $V_D$, respectively. The area of the primary nanowire 18 that is adjacent the diffused doped region 26 acts as a channel CH. In this type of transistor 10, 10', 10", the secondary nanowire 24 functions as a gate G, which has a gate electrical connection (at a voltage $V_G$) operatively connected to its terminal end. As a non-limiting example, the source S, drain D, and channel CH are doped with n-type conductivity or p-type conductivity, while the gate G is doped with the other of p-type conductivity or n-type conductivity.

A bias is applied between the gate G and the source S or drain D of the junction field-effect transistor 10, 10', 10" to modulate the electrically active thickness of the primary nanowire 18, thus modulating the current flowing between the source S and drain D when a voltage is applied between the source and drain electrodes. The junction between the gate G and the channel CH is generally reverse biased; in some instances, however, relatively small forward voltages (less than the built-in potential) may be used.

In the bipolar junction transistor 100, 100', 100" (FIG. 5B), the doped region 26 divides the primary nanowire 18 into an emitter segment E and a collector segment C. Electrical connections at voltages $V_C$ (e.g., the voltage on a collector electrode) and $V_E$ (e.g., the voltage on an emitter electrode) may be made to the terminal ends of collector segment C and the emitter segment E, respectively. In such an embodiment, the secondary nanowire 24 functions as a base B, and electrical connection at a voltage $V_B$ is connected to a terminal end thereof. As a non-limiting example, the collector and emitter segments C, E are doped with n-type conductivity or p-type conductivity, while the base B is doped with the other of p-type conductivity or n-type conductivity.

A bias is applied between the base and emitter electrodes, thereby modulating the potential barrier between the emitter E and the base B. This change in the potential barrier modulates the number of carriers injected from the emitter E into the base B. The carriers are then able to travel to the collector C.

Figure 6A:
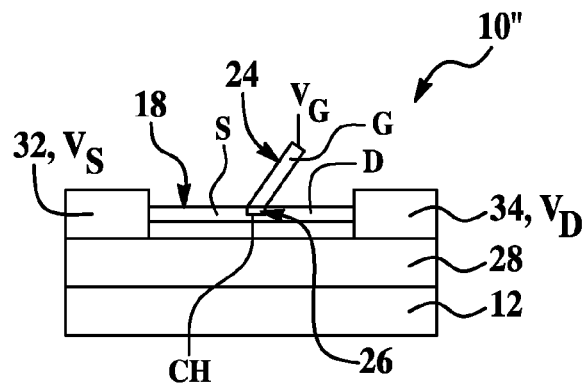
FIGS. 6A and 6B schematically depict electrical connections operatively connected to other embodiments of the junction field-effect transistor and the bipolar junction transistor, respectively.
Figure 6B:
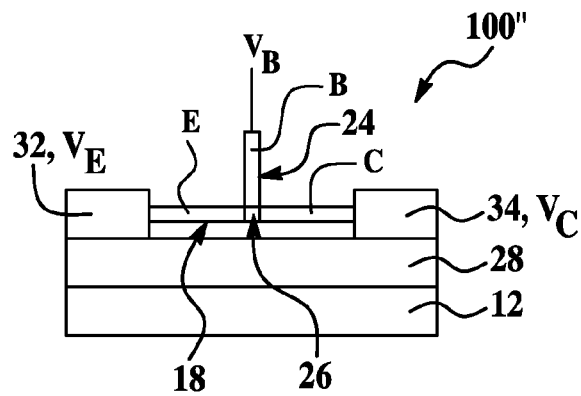

Referring now to FIGS. 6A and 6B, embodiments of the junction field-effect transistor 10, 10', 10" (FIG. 6A) and the bipolar junction transistor 100, 100', 100" (FIG. 6B) are shown having electrical connections made to three different regions of the respective devices. Specifically, the embodiments of the transistors 10", 100" depicted in FIGS. 4E and 4F are shown, respectively, in FIGS. 6A and 6B with electrical connections operatively connected thereto.

In FIG. 6A, the partially divided opposed ends of the primary nanowire 18 function as the source S and the drain D, respectively. The posts 32, 34 (formed from the silicon layer 30 of the SOI substrate) may be configured to function as electrical connections to the source S and drain D at voltages $V_S$ and $V_D$, respectively. It is to be understood that either post 32, 34 may be configured as the source S or drain D electrical connection. Generally, the posts 32, 34 are doped with the same conductivity type as the region of nanowire 18, 24 to which the electrical connection is made. This type of transistor 10, 10', 10" also includes the channel CH, the gate G, and the electrical connection at voltage $V_G$ operatively connected to the gate G. Similar to the embodiment shown in FIG. 5A, the source S, drain D, and channel CH are doped with n-type conductivity or p-type conductivity, while the gate G is doped with the other of p-type conductivity or n-type conductivity.

In FIG. 6B, the segments of the divided primary nanowire 18 function as an emitter E and a collector C, respectively. One of the posts 32, 34 may be configured as the emitter electrical connection at voltage $V_E$, while the other of the posts 34, 32 may be configured as the collector electrical connection at voltage $V_C$. Generally, the posts 32, 34 are doped with the same conductivity type as the region of nanowire 18, 24 to which the electrical connection is made. This type of transistor 100, 100', 100" also includes the base B, and the electrical connection at voltage $V_B$ operatively connected to the base B. Similar to the embodiment shown in FIG. 5B, the emitter E and collector C are doped with n-type conductivity or p-type conductivity, while the base B is doped with the other of p-type conductivity or n-type conductivity.

Referring now to FIG. 7, still another embodiment of the junction field-effect transistor 10''' is depicted. In this embodiment, the secondary nanowire 24 is grown (as previously described) so that it extends outwardly from the primary nanowire 18; however, the doped region 26 does not extend into the primary nanowire 18. As such, during formation of the transistor 10''', the nanowires 18, 24 are exposed to a predetermined temperature for a predetermined time to grow the nanowires 18, 24; however, in this embodiment, the temperature and exposure time are not sufficient to cause the dopant to diffuse from the secondary nanowire 24 into the primary nanowire 18.

As shown in FIG. 7, the partially divided opposed ends of the primary nanowire 18 function as a source S and a drain D, respectively. Electrical connections (e.g., a source electrode) and (e.g., a drain electrode) are made, respectively, to the terminal ends of the primary electrode 18 at voltages $V_S$, $V_D$. An electrical connection (e.g., gate electrode) is also made to the terminal end of the secondary nanowire 24 at voltage $V_G$. As a non-limiting example, the source S, drain D, and channel CH are doped with n-type conductivity or p-type conductivity, while the gate G is doped with the other of p-type conductivity or n-type conductivity.

FIG. 8 depicts an embodiment of a diode 1000 as the electronic device. The diode 1000 includes the primary nanowire 18, the secondary nanowire 24, and the doped region 26 extending from the secondary nanowire 24 into at least a portion of the primary nanowire 18. It is to be understood that the methods and materials discussed hereinabove in regard to the transistors 10, 10', 10", 100, 100', 100" are suitable for forming the diode 1000.

The diode 1000 has an electrical connection (e.g., anode or cathode) at a single terminal end of the primary nanowire 18 and at the terminal end of the secondary nanowire 24. The electrical connections are at voltages $V_A$, $V_{CA}$, respectively. When the anode is at a positive voltage with respect to the cathode, the diode is forward biased, and significant current is able to flow from the anode to the cathode. When the anode is at a negative voltage with respect to the cathode, the diode is reverse biased, and only a relatively small amount of current is able to flow in the opposite direction. The ratio of the magnitudes of the currents flowing under the two different bias conditions is a measure of the quality of the diode 1000.

While several embodiments have been described in detail, it will be apparent to those skilled in the art that the disclosed embodiments may be modified. Therefore, the foregoing description is to be considered exemplary rather than limiting.

What is claimed is:

1. An electronic device, comprising:
   a primary nanowire of a first conductivity type;
   a secondary nanowire of a second conductivity type crown from and extending outwardly in one direction from the primary nanowire; and
   a doped region of the second conductivity type diffused from and extending from the secondary nanowire into at least a portion of the primary nanowire.

2. The electronic device as defined in claim 1 wherein the doped region of the second conductivity type extends through at least a portion of an electrically active thickness of the primary nanowire.

3. The electronic device as defined in claim 2 wherein the electronic device is a junction field-effect transistor.

4. The electronic device as defined in claim 2 wherein the doped region extends through the entire electrically active thickness of the primary nanowire.

5. The electronic device as defined in claim 4 wherein the electronic device is a bipolar junction transistor.

6. The electronic device as defined in claim 4 wherein the doped region of the second conductivity type divides the primary nanowire into an emitter segment and a collector segment.

7. The electronic device as defined in claim 4 wherein the first conductivity type is n-type conductivity, and wherein the second conductivity type is p-type conductivity.

8. The electronic device as defined in claim 1 wherein the first conductivity type is one of p-type conductivity or n-type conductivity, and wherein the second conductivity type is an other of n-type conductivity or p-type conductivity.

9. The electronic device as defined in claim 1 wherein the electronic device is a diode, and wherein the electronic device further comprises:
   an electrical connection operatively connected to a terminal end of the primary nanowire; and
   an electrical connection operatively connected to a terminal end of the secondary nanowire.

10. A method of making an electronic device, the method comprising:
    growing a primary nanowire having a first conductivity type;
    growing, in one direction, a secondary nanowire having a second conductivity type from a surface of the primary nanowire; and
    diffusing a doped region of the second conductivity type from the secondary nanowire into at least a portion of the primary nanowire.

11. The method as defined in claim 10 wherein growing the secondary nanowire is accomplished by:
    establishing a sacrificial layer about the primary nanowire and to a predetermined height, whereby a portion of the primary nanowire is exposed;
    establishing a catalyst nanoparticle on an area of the exposed portion of the primary nanowire that is adjacent to the sacrificial layer; and
    exposing the catalyst nanoparticle to a precursor gas that initiates growth of the secondary nanowire.

12. The method as defined in claim 11 wherein establishing the catalyst nanoparticle is accomplished by depositing a pre-formed catalyst nanoparticle or by depositing a material that forms the catalyst nanoparticle.

13. The method as defined in claim 12 wherein depositing is accomplished via physical deposition processes, solution deposition processes, chemical deposition processes, electrochemical deposition processes, or combinations thereof.

14. The method as defined in claim 10 wherein diffusing is accomplished by exposing the primary and secondary nanowires to a predetermined temperature for a predetermined time.

15. The method as defined in claim 14 wherein diffusing is controlled so that the doped region of the second conductivity type extends through a portion of an electrically active thickness of the primary nanowire.

16. The method as defined in claim 14 wherein diffusing is controlled so that the doped region of the second conductivity type extends through substantially an entire thickness of the primary nanowire.

17. The method as defined in claim 10 wherein the primary nanowire is grown from one of two opposed sidewalls to an other of the two opposed sidewalls.

18. The method as defined in claim 10, further comprising:
    operatively connecting at least one electrical connection to a terminal end of the primary nanowire; and
    operatively connecting an electrical connection to a terminal end of the secondary nanowire.

19. A junction field effect transistor, comprising:
    a primary nanowire of a first conductivity type having first and second opposed terminal ends;
    a secondary nanowire of a second conductivity type grown from and extending outwardly in one direction from the primary nanowire, the secondary nanowire having a third terminal end; and
    a respective electrical connection operatively connected to each of the first, second and third terminal ends.

20. The junction field effect transistor as defined in claim 19 wherein the first conductivity type is one of p-type conductivity or n-type conductivity, and wherein the second conductivity type is an other of n-type conductivity or p-type conductivity.

* * * * *

UNITED STATES PATENT AND TRADEMARK OFFICE
CERTIFICATE OF CORRECTION

| | | |
|---|---|---|
| PATENT NO. | : 7,608,854 B2 | Page 1 of 1 |
| APPLICATION NO. | : 11/668136 | |
| DATED | : October 27, 2009 | |
| INVENTOR(S) | : Theodore I. Kamins | |

It is certified that error appears in the above-identified patent and that said Letters Patent is hereby corrected as shown below:

In column 9, line 9, in Claim 1, delete "crown" and insert -- grown --, therefor.

Signed and Sealed this

Twentieth Day of April, 2010

David J. Kappos
*Director of the United States Patent and Trademark Office*